United States Patent
Vilela et al.

(10) Patent No.: US 9,118,351 B2
(45) Date of Patent: Aug. 25, 2015

(54) SYSTEM AND METHOD FOR SIGNATURE-BASED REDUNDANCY COMPARISON

(75) Inventors: Antonio Vilela, Mering (DE); Rainer Faller, Munich (DE); Michael Goessel, Mahlow (DE); Simon Brewerton, Trowbridge (GB); Glenn Ashley Farrall, Long Ashton (GB); Neil Stuart Hastie, Gloucestershire (GB); Boyko Traykov, Munich (DE); David Addison, Bristol (GB); Klaus Oberlaender, Neubiberg (DE); Thomas Rabenalt, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 546 days.

(21) Appl. No.: 13/430,126

(22) Filed: Mar. 26, 2012

(65) Prior Publication Data

US 2013/0212441 A1 Aug. 15, 2013

Related U.S. Application Data

(60) Provisional application No. 61/599,129, filed on Feb. 15, 2012.

(51) Int. Cl.
*G06F 11/00* (2006.01)
*H03M 13/37* (2006.01)
(Continued)

(52) U.S. Cl.
CPC ............ *H03M 13/3746* (2013.01); *G05B 9/03* (2013.01); *G05B 19/0428* (2013.01); *G06F 11/00* (2013.01); *G06F 11/1048* (2013.01);
(Continued)

(58) Field of Classification Search
USPC ..................................................... 714/11, 49
See application file for complete search history.

(56) References Cited

U.S. PATENT DOCUMENTS 3,930,146 A 12/1975 Bogacz
4,035,766 A 7/1977 Barker
(Continued)

FOREIGN PATENT DOCUMENTS

CN 101901176 A 12/2010
EP 1168178 A2 1/2002
(Continued)

OTHER PUBLICATIONS

Non Final Office Action Dated May 21, 2014 U.S. Appl. No. 13/430,147.
(Continued)

*Primary Examiner* — Sarai Butler
(74) *Attorney, Agent, or Firm* — Eschweiler & Asociates, LLC

(57) ABSTRACT

A system and method for signature-based redundancy comparison provides for receiving, by a master part, an input signal and generating, by the master part, a binary output signal, generating a delayed input signal based on the input signal, generating a first output signature based on the binary output signal, and generating a delayed first output signature based on the first output signature. The system and method further comprise generating a delayed binary output signal based on the delayed input signal, generating, by a checker part, a delayed second output signature based on the delayed binary output signal, comparing the delayed first output signature with the delayed second output signature, and generating an error signal, where the state of the error signal is based upon the comparison.

36 Claims, 6 Drawing Sheets

(51) Int. Cl.
G05B 19/042 (2006.01)
G05B 9/03 (2006.01)
G06F 11/16 (2006.01)
G06F 11/10 (2006.01)
G06F 11/14 (2006.01)
H03M 13/03 (2006.01)
H03M 13/15 (2006.01)
H03M 13/19 (2006.01)
H03M 13/25 (2006.01)
H03M 13/29 (2006.01)
H03M 13/00 (2006.01)

(52) U.S. Cl.
CPC ........ *G06F11/1479* (2013.01); *G06F 11/1641* (2013.01); *H03M 13/033* (2013.01); *H03M 13/155* (2013.01); *H03M 13/19* (2013.01); *H03M 13/258* (2013.01); *H03M 13/299* (2013.01); *H03M 13/2948* (2013.01); *H03M 13/2957* (2013.01); *H03M 13/2966* (2013.01); *H03M 13/37* (2013.01); *H03M 13/3738* (2013.01); *H03M 13/3784* (2013.01); *H03M 13/6575* (2013.01)

(56) References Cited

U.S. PATENT DOCUMENTS

| | | |
|---|---|---|
| 4,326,291 A | 4/1982 | Marsh et al. |
| 7,127,668 B2 | 10/2006 | McBryde et al. |
| 7,203,890 B1 | 4/2007 | Normoyle |
| 7,861,131 B1 | 12/2010 | Xu et al. |
| 8,069,392 B1 | 11/2011 | Norrie |
| 8,086,945 B1 | 12/2011 | Xu et al. |
| 8,136,009 B2 | 3/2012 | Goessel et al. |
| 2007/0277070 A1 | 11/2007 | Janke et al. |
| 2009/0289663 A1 | 11/2009 | Sogomonyan et al. |
| 2011/0041013 A1 | 2/2011 | Ingimundarson |
| 2011/0138249 A1 | 6/2011 | Kern et al. |
| 2012/0054580 A1 | 3/2012 | Sakaue |
| 2012/0144260 A1 | 6/2012 | Kern et al. |
| 2012/0166890 A1* | 6/2012 | Janarthanam et al. .......... 714/49 |
| 2013/0103991 A1 | 4/2013 | Evain et al. |

FOREIGN PATENT DOCUMENTS

| | | |
|---|---|---|
| GB | 2318035 A | 4/1998 |
| JP | 088760 A | 1/1996 |
| JP | 2003058208 A | 2/2003 |
| WO | 2012004065 A1 | 1/2012 |

OTHER PUBLICATIONS

US Patent Application dated Mar. 26, 2012 U.S. Appl. No. 13/430,147.

Kundu, S., et al. "Self-Checking Comparator with One Periodic Output." IEE Transactions on Computers, vol. 45, No. 3., Mar. 1996.

Notice of Allowance Dated Oct. 17, 2014 U.S. Appl. No. 13/430,147.

* cited by examiner

SYSTEM AND METHOD FOR SIGNATURE-BASED REDUNDANCY COMPARISON

CROSS-REFERENCE TO RELATED APPLICATION

This application is related to, and filed concurrently on Mar. 26, 2012, with U.S. patent application Ser. No. 13/430,147 entitled "Apparatus and Method for Comparing Pairs of Binary Words", and claims priority to Provisional Patent Application No. 61/599,129, filed on Feb. 15, 2012, entitled, "A Duplex System and Method for Signature-Based Comparisons", the contents both of which are hereby incorporated by reference.

FIELD

Certain embodiments of the invention relate to providing diagnostic coverage in computational systems and methods. More specifically, certain embodiments of the invention relate to systems and methods for diagnostic signature generation within redundant systems to provide for failure detection, including failures caused by common cause faults, logical stuck-at-faults, and cross-coupling faults.

BACKGROUND

Integration of functions inside an electronic control unit (ECU) is mainly concentrated around a safe microcontroller that plays a central role by hosting critical computation and control functions. As a result of sub-micron technologies it has become economically possible to integrate large-scale redundant structures (e.g., duplex-systems) inside ECUs, microcontrollers, and other types of integrated electronic and computational systems, whether or not such systems relate to safety-related computations and/or control functions. Typically, such systems form the basic hardware architecture upon which safety software rely (e.g., applications requiring the ISO 26262 ASIL D safety integrity level).

However, typical duplex systems require cycle-by-cycle hardware-based comparisons of every functional output, as well as complex, common-cause failure analyses based on delaying the redundant parts by one or more clock cycles, resulting in large power consumption and large chip area related to the integration of the duplex structures within a microcontroller, for example.

Furthermore, a consequence for large duplex systems is the cost of the delay stages for the inputs and outputs, as well as complex comparator logic. For instance, for a delay of 2 cycles, assuming 1000 inputs and 1000 outputs, the cost of the delay is 4000 flip-flops. In addition to the area required to integrate a large number of flip flops, power consumption becomes a limiting factor when extending such a system, as well as when operating at higher frequencies which typically requires a higher delay (i.e., a higher number of delay cycles).

It would be advantageous to provide solutions that reduce power consumption and area related to the integration of redundant-type structures inside high integrity electronic systems while retaining a high level of error detection provided by such redundant-structures. It is also of interest to provide redundant-structures that detect internal faults and faults at output-lines during normal operation.

SUMMARY

According to an embodiment of the invention, a redundant system comprises a master part configure to receive an input signal and generate a binary output signal, a first clock delay configured to receive the input signal and generate a delayed input signal, and a first signature generator coupled to the master part and configured to receive the binary output signal and generate a first output signature. The system further comprises a second clock delay coupled to the first signature generator and configured to receive the first output signature and generate a delayed first output signature, a checker part coupled to the first clock delay and configured to receive the delayed input signal and generate a delayed binary output signal, a second signature generator coupled to the checker part and configured to receive the delayed binary output signal and generate a delayed second output signature, and a comparator coupled to the second clock delay and the second signature generator. The comparator is configured to receive the delayed first output signature and the delayed second output signature and generate an error signal, wherein a state of the error signal is based upon a comparison of the delayed first output signature with the delayed second output signature.

According to an embodiment of the invention, a method for signature-based redundancy comparison comprises receiving, by a master part, an input signal and generating, by the master part, a binary output signal, generating a delayed input signal based on the input signal, and generating a first output signature based on the binary output signal. The method further comprises generating a delayed first output signature based on the first output signature, generating a delayed binary output signal based on the delayed input signal, generating, by a checker part, a delayed second output signature based on the delayed binary output signal, comparing, by a comparator, the delayed first output signature with the delayed second output signature, and generating an error signal, a state of the error signal based upon the comparison.

DETAILED DESCRIPTION

Figure 1:
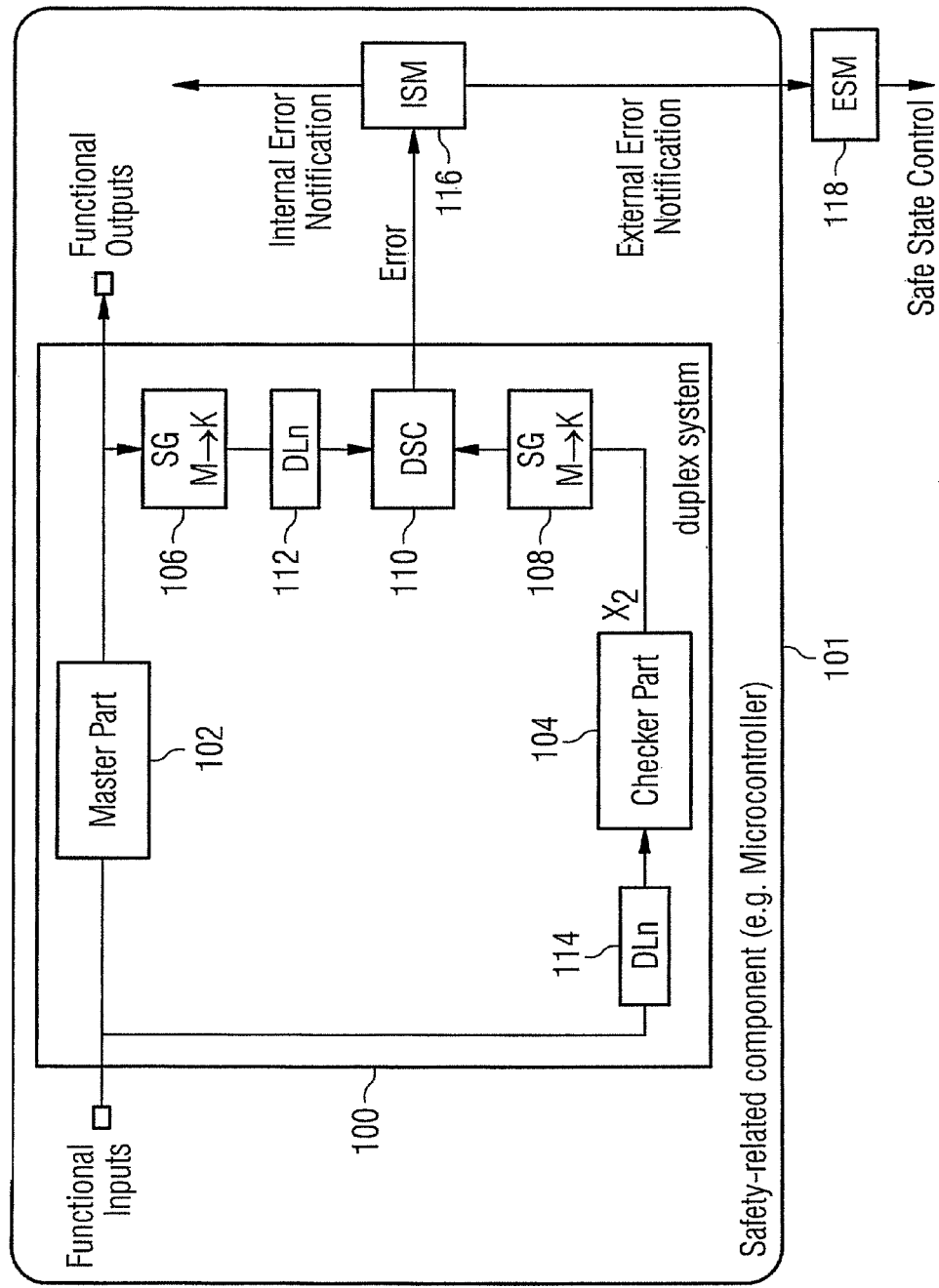
FIG. 1 is a schematic diagram of a duplex system, according to an embodiment of the invention.

FIG. 1 is a schematic diagram of a duplex system 100, according to an embodiment of the invention. In the exemplary embodiment as illustrated, the duplex system 100 is a component of a safety-related component 101 (e.g., a microcontroller), however, the duplex system may be integrated with (or a component of) any type of high-integrity computational systems, such as banking systems, as well as other types of safety-related systems, such as, for example, an electronic control unit (ECU). ECUs have applications in various types of machinery, electronics, avionics, and automotive systems, for example.

The duplex system 100 includes a master part 102, a checker part 104, a first signature generator 106, a second signature generator 108, a duplex system comparator (DSC) 110, an optional first clock delay (DLn) 112 and an optional second clock delay (DLn) 114. The master part 102 may be a processing unit, such as a central processing unit (CPU). However, the scope of the invention covers a master part comprising any combination of hardware and software configured to perform any type of electronic function. The checker part 104 is configured to perform the same type of electronic function(s) of the master part 102. In one embodiment, the checker part 104 is a replica of the master part 102, however, in other embodiments the checker part 104 performs the same function(s) on functional input(s) as the master part 102, but is not an exact hardware and/or software replica of the master part 102. In another embodiment the checker part 104 and the second signature generator 108 may be at least partially jointly implemented or optimized. The master part and the checker part may be referred collectively as redundant parts of the duplex system 100. Although the clock delays are optional, they may be used to reduce the effects of common causes by adding temporal diversity in the two paths.

Although the exemplary embodiment as illustrated is a duplex system 100, the scope of the invention covers redundant systems in general, such as a redundant system comprising a plurality of computing nodes in a cluster. The redundant parts may comprise any subset of the plurality of computing nodes, greater or equal to any combination of two computing nodes. In another embodiment, the redundant system may comprise redundant nodes in two or more clusters. The scope of the invention is not limited to duplex systems.

The first signature generator 106 receives an output from the master part 102 and the second signature generator 108 receives an output from the checker part 104. The first signature generator 106 operates on the output from the master part 102 to generate a first output signature and the second signature generator 108 operates on the output from the checker part 104 to generate a second output signature.

In one embodiment of the invention, the first signature generator 106 is a first compactor that receives M binary inputs from the master part 102 and generates K binary outputs and the second signature generator 108 is a second compactor that receives M binary inputs from the checker part 104 and generates K binary outputs, where K<M. The signature generators will be described more fully below.

In one embodiment of the invention, the second clock delay 114 delays the functional input(s) (also referred to as the input signal) to the checker part 104 by n clock cycles, thereby adding time diversity between the redundant parts 102 and 104. Adding time diversity between the redundant parts helps to statistically reduce the effects of coupling factors. Typical coupling factors are, for example, power supply disturbances that influence the intrinsic timing parameters of any gates, for example, of the redundant parts which lead to violation of setup or hold times. The first clock delay 112 delays reception, by the DSC 110, of the first output signature generated by the first signature generator 106, thereby enabling the DSC 110 to compare corresponding output signatures in order to detect whether an error is present.

The DSC 110 compares the two delayed output signatures, and based upon the comparison, generates an error signal of a particular state. The DSC 110 will be discussed more fully below.

In operation, the master part 102 and the second delay 114 receive an input signal. The second delay 114 delays the input signal by n clock cycles to generate a delayed input signal. The master part 102 operates on the input signal to generate a binary output signal comprising M binary components, and the checker part 104 operates on the delayed input signal to generate a delayed binary output signal comprising M delayed binary components. The first signature generator 106 compacts the binary output signal to generate a first output signature comprising K binary components. The second signature generator 108 compacts the delayed binary output signal to generate a delayed second output signature comprising K binary components. The first clock delay 112 delays the first output signature to generate a delayed first output signature. The DSC 110 compares the delayed first output signature with the delayed second output signature, and based upon the results of this comparison, generates an error signal of a particular state.

In an embodiment of the invention, an internal safety monitor (ISM) 116 receives the error signal, and generates an internal error notification and/or an external error notification signal based at least partly upon the state of the error signal.

In one embodiment of the invention, one or more components internal to the safety-related component 101 may receive the internal error notification signal from the ISM 116, and based upon the state of the signal (e.g., high, low or dual-rail), may be disabled, enabled or enabled to operate in a reduced functional mode. The external error notification signal may be received by an external safety monitor (ESM) 118. The ESM 118 may generate a safe state control signal based upon the received external error notification signal.

In a further embodiment of the invention, one or more components external to the safety-related component 101 may receive the safe state control signal from the ESM 118, and based upon the state of the signal (e.g., high, low or dual-rail), may also be disabled, enabled or enabled to operate in a reduced functional mode.

Figure 2:
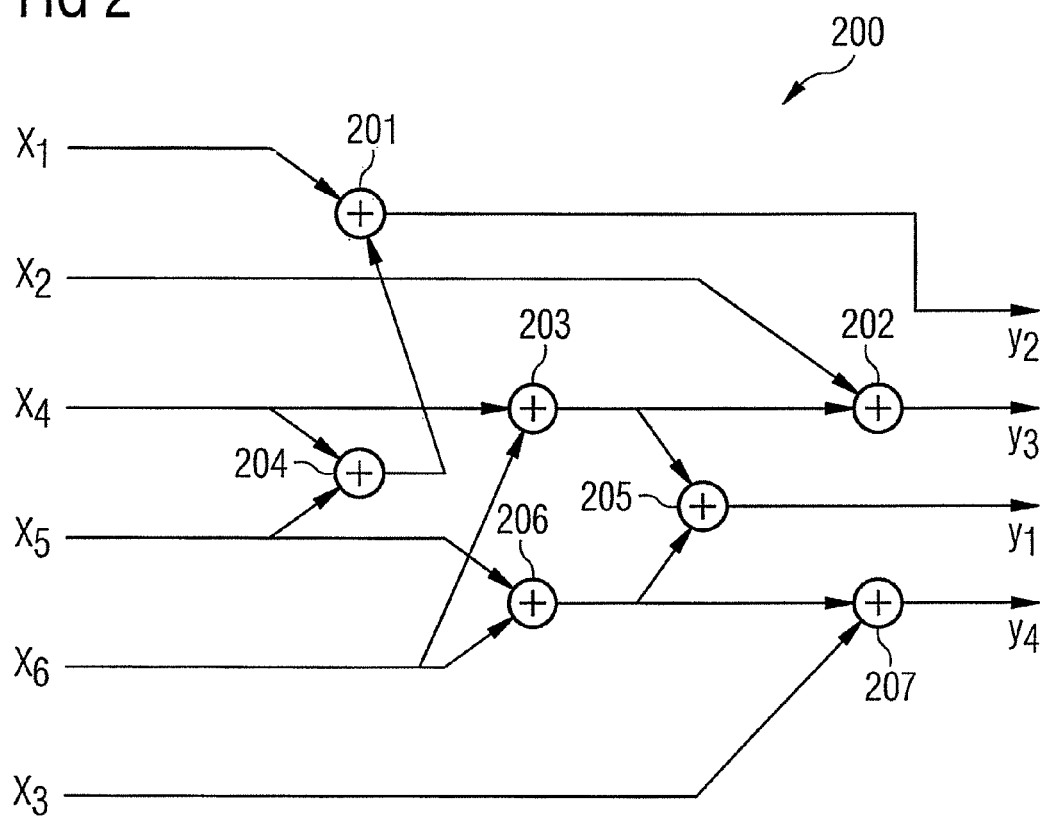
FIG. 2 is a schematic diagram of a linear compactor, according to an embodiment of the invention.

FIG. 2 is a schematic diagram of a linear compactor 200, according to an embodiment of the invention. The first signature generator 106 and/or the second signature generator 108 may be implemented as the linear compactor 200. The linear compactor 200 as illustrated comprises seven 2-input XOR-Gates 201-207. The compactor 200 receives an M-component (i.e., M-dimensional) input signal x comprising M=6 binary input components and generates a K-component (i.e., K-dimensional) output signal y comprising 4 binary output components. The input signal x may be equivalent to the binary output signal generated by the master part 102 or to the delayed binary output signal generated by the checker part 104, as illustrated in FIG. 1.

Although the linear compactor 200 as illustrated comprises seven 2-input XOR-Gates 201-207 with specific interconnections between the XOR-Gates, the input signal components, and the output signal components to generate a 4-component output signal from a 6-component input signal, the scope of the invention covers linear compactors comprising any number of XOR-Gates without any restrictions on the specific interconnections of the XOR-Gates which generate K-component output signals from M-component input signals, where K<M.

The M-dimensional input $x=x_1, \ldots, x_M$ may be represented as an M-dimensional column vector and the K-dimensional output $y=y_1, \ldots, y_K$ may be represented as a K-dimensional column vector, where $$y = H \cdot x, \qquad (1)$$

and H is a (K,M)-matrix of K rows and M columns. The matrix H is the compaction matrix of the linear compactor 200. As an example of an exemplary embodiment for the following discussion, a compaction matrix with M=6 and K=4 is considered, where $$H = \begin{pmatrix} 0 & 0 & 0 & 1 & 1 & 1 \\ 1 & 0 & 0 & 1 & 1 & 0 \\ 0 & 1 & 0 & 1 & 0 & 1 \\ 0 & 0 & 1 & 0 & 1 & 1 \end{pmatrix} \quad (2)$$

For the components $y_1$, $y_2$, $y_3$, $y_4$ of the compacted output vector y we have from formulas (2) and (3):

$y_1 = x_4 \oplus x_5 \oplus x_6$, $y_2 = x_1 \oplus x_4 \oplus x_5$, $y_3 = x_2 \oplus x_4 \oplus x_6$, $y_4 = x_3 \oplus x_5 \oplus x_6$.

For example, an input vector x=1,0,1,0,1,1 is compacted into a corresponding output vector y=H·x=0,0,1,1.

The linear compactor 200 has the property that if the number of ones in every row of the compaction matrix H is odd, and if all the columns of H are pair-wise different, as is the case of the compaction matrix H of equation (2), then the compacted output vector $y(\bar{x})$ of the inverted input vector $\bar{x} = \bar{x}_1, \ldots, \bar{x}_M$ is equal to the inverted compacted output vector $\bar{y}(x)$ of the output vector y(x). In addition, the linear compactor 200 has the property that an input vector $$\underbrace{1, 1, \ldots, 1}_{M}$$

is compacted into an output vector $$\underbrace{1, 1, \ldots, 1}_{K}.$$

Also if the linear compactor 200 has the property that columns of H comprise an odd number of ones, and if all the columns of H are pair-wise different, as is the case of the compaction matrix H of equation (2), then the compaction matrix has the properties that $h_i \neq 0$, $h_i \oplus h_j \neq 0$, and $h_i \oplus h_j \oplus h_k \neq 0$ for $i \neq j \neq k$ In other words, an input vector x', which is different from an input vector x in 1, or 2 or 3 bit positions will result in a compacted output vector y' which is different from the compacted output vector of the input vector x. This is advantageous since internal faults result very often in 1-bit errors, two-bit errors or 3-bit errors, thereby changing the input vector x of the compactor in 1, 2 or 3 bits. Any of these errors will be detected with 100% probability when the compacted outputs of linear compactors having these properties are compared by the DSC 110.

The compaction matrix H may also be referred to as the transfer function of the signature generators 106 and 108. In one embodiment of the invention, the transfer function of the first signature generator 106 is equal to the transfer function of the second signature generator 108. However, the scope of the present invention covers signature generators having different transfer functions. For example, the transfer function of the second signature generator 108 may be the inverted transfer function of the first signature generator 106. In another embodiment the signature generator(s) may also implement a nonlinear transfer function. Thus, for example, the output vector of the signature generator(s) can also be the vector of check bits of a Berger code. The determination of check bits of a Berger code are known to a person skilled in the art and are described for instance in Berger, J. M., "A note of Error Detection Codes for Asymmetric Channels;" Information and Control, Vol. 4, 1961, pp. 68-73. In another embodiment the signature generator(s) may also contain delay elements, as in the case of the convolutional compactor described in Mrugalsi, G. at al., "Fault Diagnosis in Designs with Convolutional Compactors" Proc. ITC 2004, paper 17.2, pp. 498-507.

In a further embodiment of the invention, the compactor 200 receives the M-component input signal x and compacts a subset of the M binary input components. For example, if the linear compactor compacts J binary input components to generate K output components, then the output signal y will comprise K+(M−J) binary components, where K<J≤M.

Figure 3:
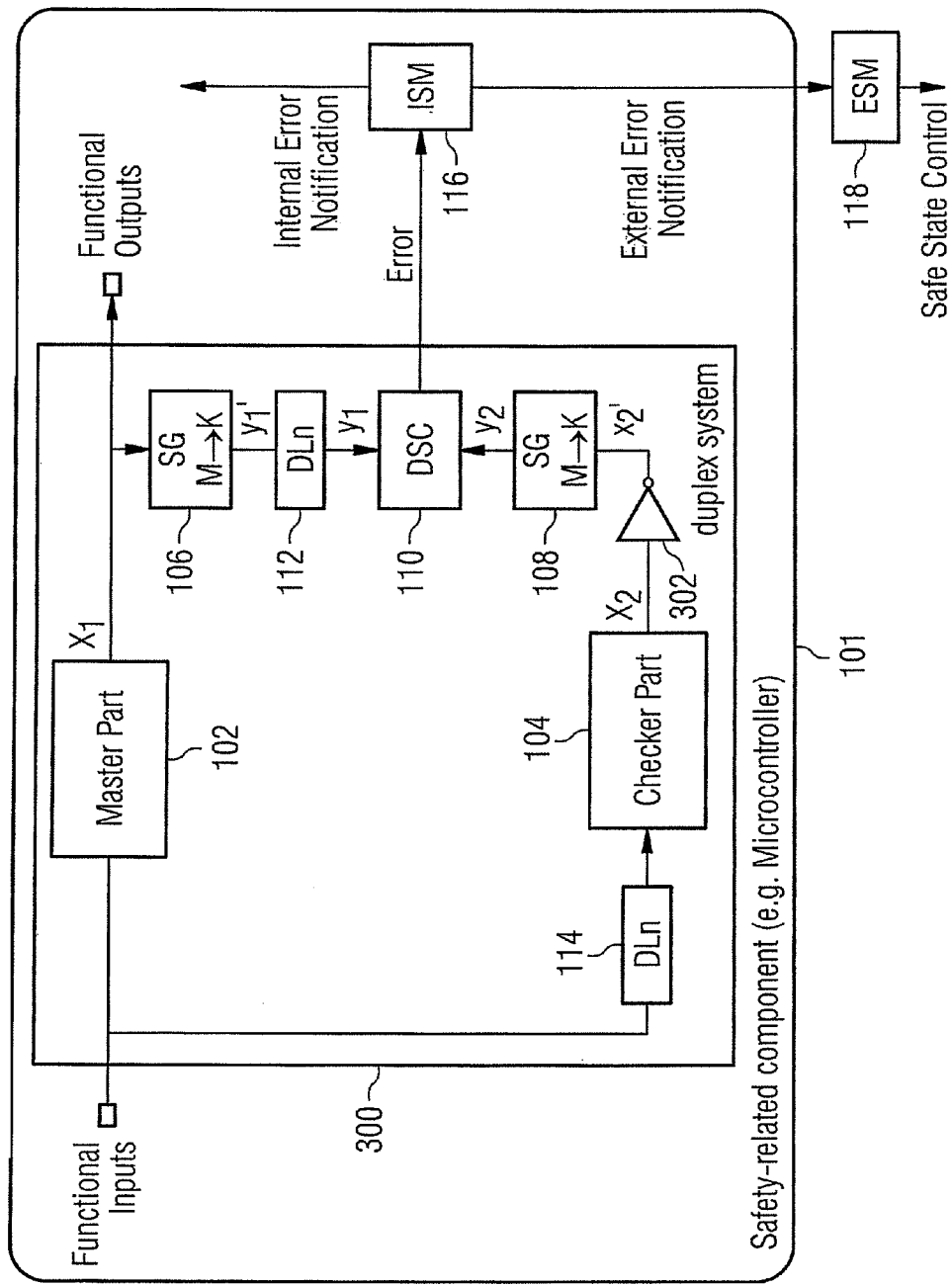
FIG. 3 is a schematic diagram of a duplex system, according to an embodiment of the invention.

FIG. 3 is a schematic diagram of a duplex system 300, according to an embodiment of the invention. Elements of the duplex system 300 which are identical to elements of the duplex system 100 have like reference numbers. The duplex system 300 includes a data diversification unit (DDU). In one embodiment of the invention, the DDU is an inverter 302.

In operation, the inverter 302 inverts the delayed binary output signal $x_2$ received from the checker part 104 to generate a signal $x_{2'}$. The second signature generator 108 may be a linear compactor with a compaction matrix H. Then the second signature generator 108 generates a delayed second output signature $y_2$, where $y_2 = Hx_{2'}$. The first signature generator 106 may be also a linear compactor with the same compaction matrix H as the second signature generator 108, and operates on the binary output signal $x_1$ received from the master part 102 to generate a first output signature $y_1'$, where $y_1' = Hx_1$. If the number of ones in every row of the matrix H are odd, as is the case of the compaction matrix H of equation (2), then the All-1 vector $x_1 = 1, \ldots, 1$ of M ones is compacted into the All-1 vector $y_{1'} = 1, \ldots, 1$ of K ones. Since the compactor is linear the XOR-sum of two vectors x and x" is compacted into the XOR-sum of the corresponding output vectors of the compactor. An inverted vector/x may be considered as a component-wise XOR-sum of the vector x and the All-1 vector. Therefore the compacted output vector of the inverted input vector of the second signature generator is equal to the inverted compacted output vector of the first signature generator. If there are no errors in the output data (as represented by the output signatures), then $y_2 = /y_1$ (i.e., $y_1$ inverted), and the DSC 110 is implemented as a two-rail checker.

In one embodiment, if the DSC 110 determines that $y_2 = /y_1$, then the error signal will be a binary low, otherwise the error signal will be binary high. However, as will be discussed more fully below, the DSC 110 may also generate a dual-rail error signal having a state based upon whether or not $y_2 = /y_1$.

In one embodiment of the invention, the transfer function of the first signature generator 106 is not equivalent to the transfer function of the second signature generator 108. Since the input signal to the second signature generator 108 $x_{2'}$ is an inversion of the input signal $x_1$ to the first signature generator 106, given that there are no data errors present in either of the input signals, then the transfer function of the second signature generator 108 can be derived from the transfer function of the first signature generator 106 to result in $y_2 = /y_1$, by methods known to those of skill in the art.

A duplex system, such as duplex system 300 having inverter 302 along with signature generators having different transfer functions, allows for the incorporation of information diversity between the signature generators. In effect, the addition of information diversity mitigates the effects of common mode errors (i.e., errors common to signature generators having equivalent transfer functions and pair-wise identical inputs) that may otherwise go undetected.

Figure 4:
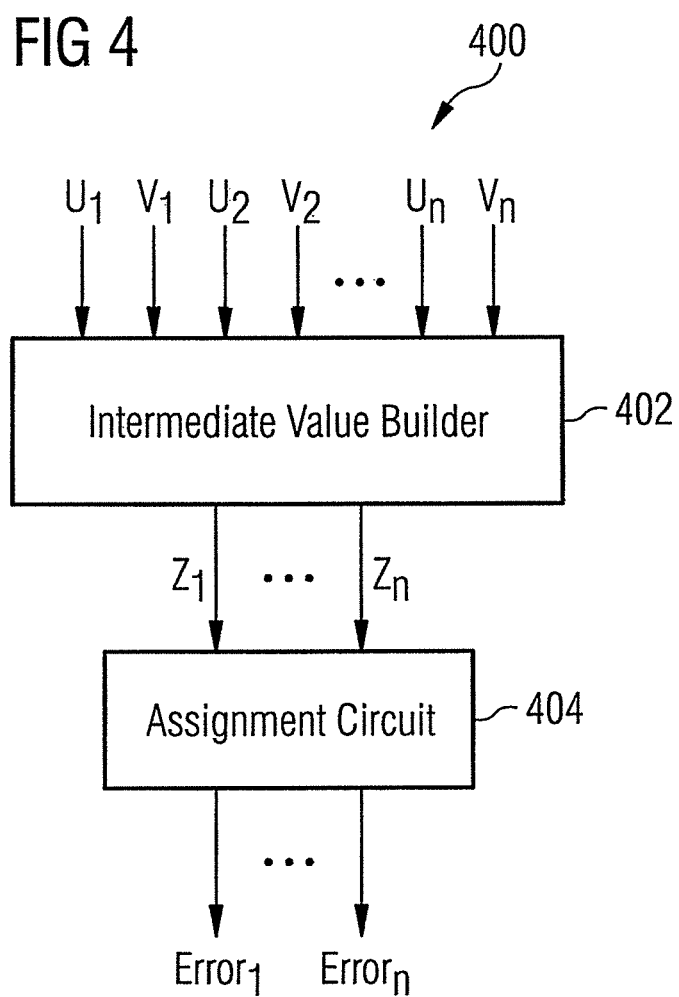
FIG. 4 is a schematic of a self-testing comparator, according to an embodiment of the invention.

FIG. 4 is a schematic of a self-testing comparator (STC) 400, according to an embodiment of the invention. The DSC 110, as illustrated in FIGS. 1 and 3, may be implemented as the STC 400. The STC 400 may receive and compare inputs that either have or have not been inverted with respect to one another.

The STC 400 comprises a first combinational circuit 402 and a second combinational circuit 404. In the exemplary embodiment as illustrated, the first combinational circuit 402 is an intermediate-value-builder (IVB) circuit 402, which has 2n binary inputs $u_1, v_1, u_2, v_2, \ldots u_n, v_n$ and n binary outputs $z_1, \ldots, z_n$. The n output signals $z_1, \ldots, z_n$ are called intermediate signals. In one embodiment, the signal $y_1$ received by the DSC 110 as illustrated in FIG. 3 comprises the components $v_1, v_2 \ldots v_n$ and the signal $y_2$ received by the DSC 110 comprises the components $u_1, u_2 \ldots u_n$. The IVB circuit 402 is designed such that the intermediate values are determined as $$z_1 = u_1 \oplus v_1 \oplus a_1 u_1 \oplus a_2 u_2 \oplus \ldots \oplus a_n u_n \oplus b_1 v_1 \oplus b_2 v_2 \oplus \ldots \oplus b_n v_n \oplus A_1$$

$$z_2 = u_2 \oplus v_2 \oplus a_1 u_1 \oplus a_2 u_2 \oplus \ldots \oplus a_n u_n \oplus b_1 v_1 \oplus b_2 v_2 \oplus \ldots \oplus b_n v_n \oplus A_2$$

$$\vdots$$

$$z_n = u_n \oplus v_n \oplus a_1 u_1 \oplus a_2 u_2 \oplus \ldots \oplus a_n u_n \oplus b_1 v_1 \oplus b_2 v_2 \oplus \ldots \oplus b_n v_n \oplus A_n$$

where $a_1 \ldots a_n, b_1, \ldots, b_n$, and $A_1, \ldots, A_n$ are binary coefficients with the conditions:

$$a_i \wedge b_j = 0 \text{ for } i=1, \ldots, n$$

and $$V_{i=1}{}^n a_i \vee V_{j=1}{}^n b_j = 1,$$

where $\oplus$ is the logical exclusive OR operation, $\wedge$ is the logical AND operation, v is the logical OR operation, and $V_{i=1}{}^n a_i$ is the logical SUMMATION (OR) operation. In one embodiment of the invention, the $A_i$ are Boolean constants. The intermediate values of the self-testing comparator (STC) of the exemplary embodiment are determined by linear equations from the input values. In the exemplary embodiment as illustrated, the second combinational circuit 404 is an assignment circuit 404. The assignment circuit 404 is designed such that the r outputs $Error_1, \ldots, Error_r$, with r≥1, are determined from the intermediate values such that, if we have for all i∈{1, \ldots, n} either $z_i = A_i$ or $z_i = A_i \oplus 1$, the error output signals error will indicated no error. However, if this condition fails, the error output signals will indicate an error.

If, for example, r=2, the assignment circuit 404 can be designed such that $$Error_1 = V_{i=1}{}^n (x_i \oplus A_i),$$

$$Error_2 = \overline{\wedge_{i=1}{}^n (z_i \oplus A_i)}.$$

Thus, if $z_i = A_i$ for i=1, \ldots, n, $Error_1 = 0$ and $Error_2 = 1$, and if $z_i = A_i \oplus 1$ for i=1, \ldots, n, $Error_1 = 1$ and $Error_2 = 0$. However, if neither of these conditions hold, then either both of the error output signal will be high (i.e., the value 1), or both of the error output signals will be low (i.e., the value zero).

Figure 5:
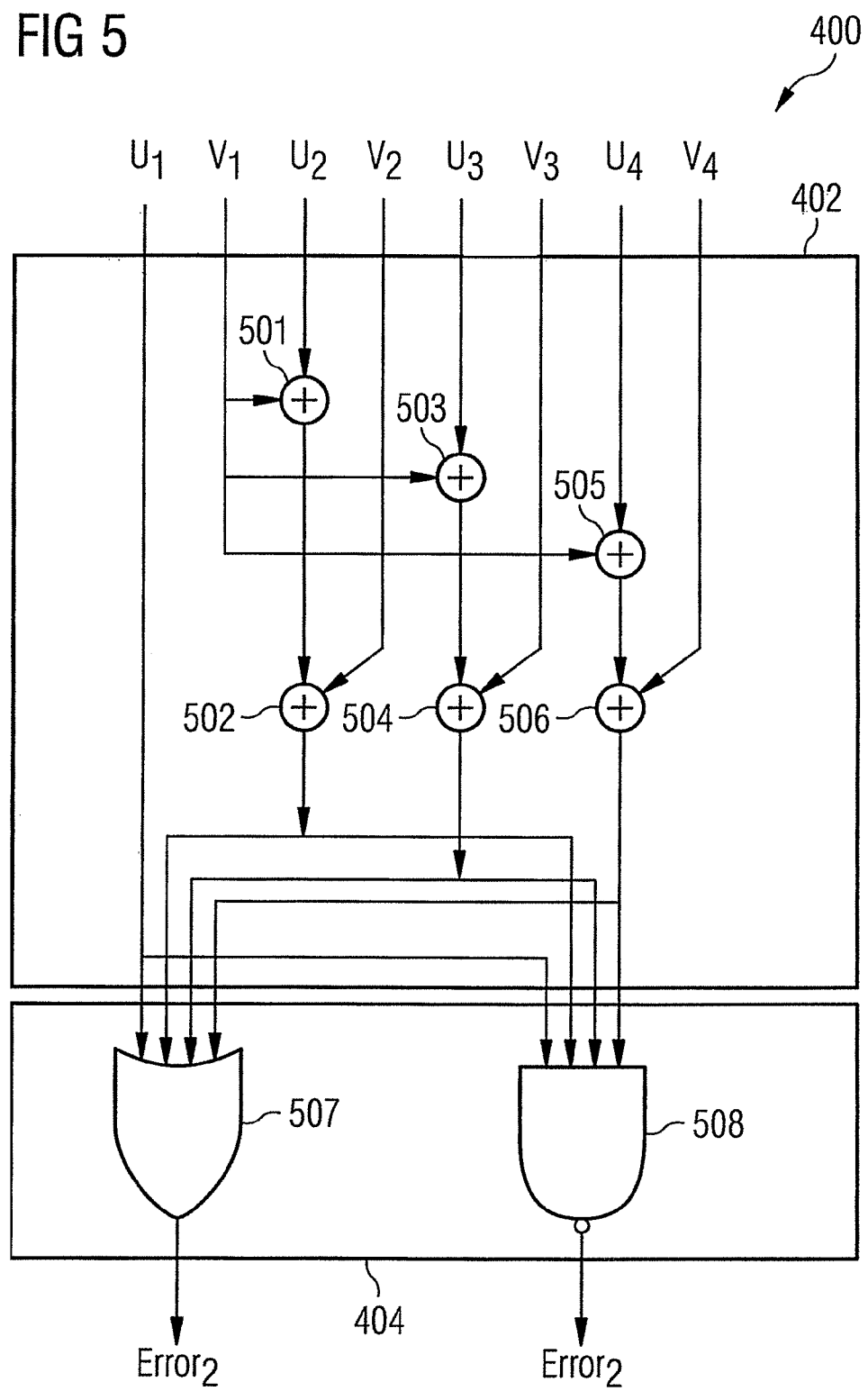
FIG. 5 is a schematic diagram of the intermediate-value-builder and the assignment circuit of the self-testing comparator illustrated in FIG. 4, according to an embodiment of the invention.

FIG. 5 is a schematic diagram of the IVB 402 and the assignment circuit 404 of the STC 400 illustrated in FIG. 4, according to an embodiment of the invention. In the exemplary embodiment as illustrated, the IVB 402 comprises XOR-Gates 501-506 and the assignment circuit 404 comprises an OR-Gate 507 and a NAND-Gate 508.

In the exemplary embodiment as illustrated, n=4, $a_1=a_2=a_3=a_4=0$, $b_1=1$, $b_2=b_3=b_4=0$, r=2 and $A_1=A_2=A_3=A_4=0$. Although FIG. 5 illustrates a specific implementation by way of example, the scope of the present invention covers any combination of inputs, outputs, and corresponding values of $a_1 \ldots a_n$; $b_1 \ldots b_n$; and $A_1, \ldots A_n$.

For the exemplary embodiment as illustrated, $$a_1 u_1 \oplus a_2 u_2 \oplus \ldots \oplus a_n u_n \oplus b_1 v_1 \oplus b_2 v_2 \oplus \ldots \oplus b_n v_n = v_1$$

and the intermediate values are determined as $$z_1 = u_1,$$

$$z_2 = u_2 \oplus v_2 \oplus v_1,$$

$$z_3 = u_3 \oplus v_3 \oplus v_1$$

$$z_4 = u_4 \oplus v_4 \oplus v_1.$$

The error signals are $$Error_1 = z_1 \vee z_2 \vee z_3 \vee z_4$$

$$Error_2 = \overline{z_1 \wedge z_2 \wedge z_3 \wedge z_4}$$

It can be seen that all the XOR-Gates 501-506 are completely tested during normal operation (i.e., operation without an error) in that all possible values 00, 01, 10 and 11 are applied to the inputs of the XOR-Gates.

The input values of the OR-Gate 507 and of the NAND-Gate 508 are, as long as no error occurs, either 0,0,0,0 or 1,1,1,1. Let us assume that the STC 400 is used as an equality checker. In other words, if no error occurs, $u_i = v_i$ for i=1, \ldots, n=4.

Also, by way of example, assume that $u_1 = v_1 = 0$, $u_2 = v_2 = 1$, $u_3 = v_3 = 1$ and $n_4 = v_4 = 0$. Then the outputs of the XOR-Gates 501, 503 and 505 are equal to 1, 1 and 0 respectively, the outputs of the XOR-gates 502, 504 and 506 are all equal to 0, and all the inputs to the OR-Gate 507 and the NAND-Gate 508 are equal to 0. This results in two-rail or complementary error signals $Error_1 = 0$ and $Error_2 = 1$, which implies no error.

By way of a further example, let us now assume that $u_1 = v_1 = 1$, $u_2 = v_2 = 1$, $u_3 = v_3 = 1$ and $u_4 = v_4 = 0$. Then the outputs of the OR-Gates 501, 503 and 505 are equal to 0, 0 and 1 respectively, the outputs of the XOR-gates 502, 504 and 506 are all equal to 1, and all the inputs to the OR-Gate 507 and the NAND-Gate 508 are equal to 1. This results in two-rail or complementary error signals $Error_1 = 1$ and $Error_2 = 0$, which also implies no error.

To demonstrate the error detection capability of the LCSS 400, let us now assume that $u_1 = v_1, = u_2 = v_2 = 1, u_3 = 1, u_4 = v_4 = 0$, however $v_3 = 0$. Then the outputs of the XOR-Gates 501, 503 and 505 are equal to 0, 0 and 1, respectively. The output of the XOR-Gate 502 is equal to 1, the output of the XOR-Gate 504 is equal to 0 and the output of the XOR-Gate 506 is equal to 1. The input values for the OR-Gate 507 and to the NAND-Gate 508 are 1,1,0,1, resulting in non-two-rail error signals (i.e. non-complementary) $Error_1 = 1$ and $Error_2 = 1$, thereby signifying an error.

According to one embodiment of the invention, the output of the STC 400 is two-rail, where (Error1, Error2)=(1,0) or (0,1) signifies no error, and (Error1, Error2)=(1,1) or (0,0) signifies an error.

The STC 400 can also receive inputs that are binary complements of (i.e., inverse of) each other. For example, if no error occurs, the input signals to the STC 400, as implemented by the exemplary embodiment of FIG. 5, are $$u_i = \bar{v}_i \text{ for } i=1, \ldots, n$$

and the intermediate values are determined as $$z_1 = u_1 = 1 \oplus v_1$$

$$z_2 = 1 \oplus v_1,$$

$$z_2 = 1 \oplus v_1,$$

$$z_2 = 1 \oplus v_1,$$

For $v_1=0$, all the intermediate values $z_1, \ldots, z_{n=4}$ are equal to 1 and for $v_1=1$ all the intermediate values $z_1, \ldots, z_{n=4}$ are equal to 0. Thus, for $v_1=0$, $Error_1=1$ and $Error_2=0$. For $v_1=1$, $Error_1=0$ and $Error_2=1$. In other words, the error signals are two-rail or complementary (i.e., either (1,0) or (0,1)) as long as no error occurs. It can also be seen that for an arbitrary error at the inputs for which not all inputs are simultaneously erroneous, the error signals $Error_1$ and $Error_2$ are two-rail (i.e., either (1,1) or (0,0)), and thus, an error can be detected.

Figure 6:
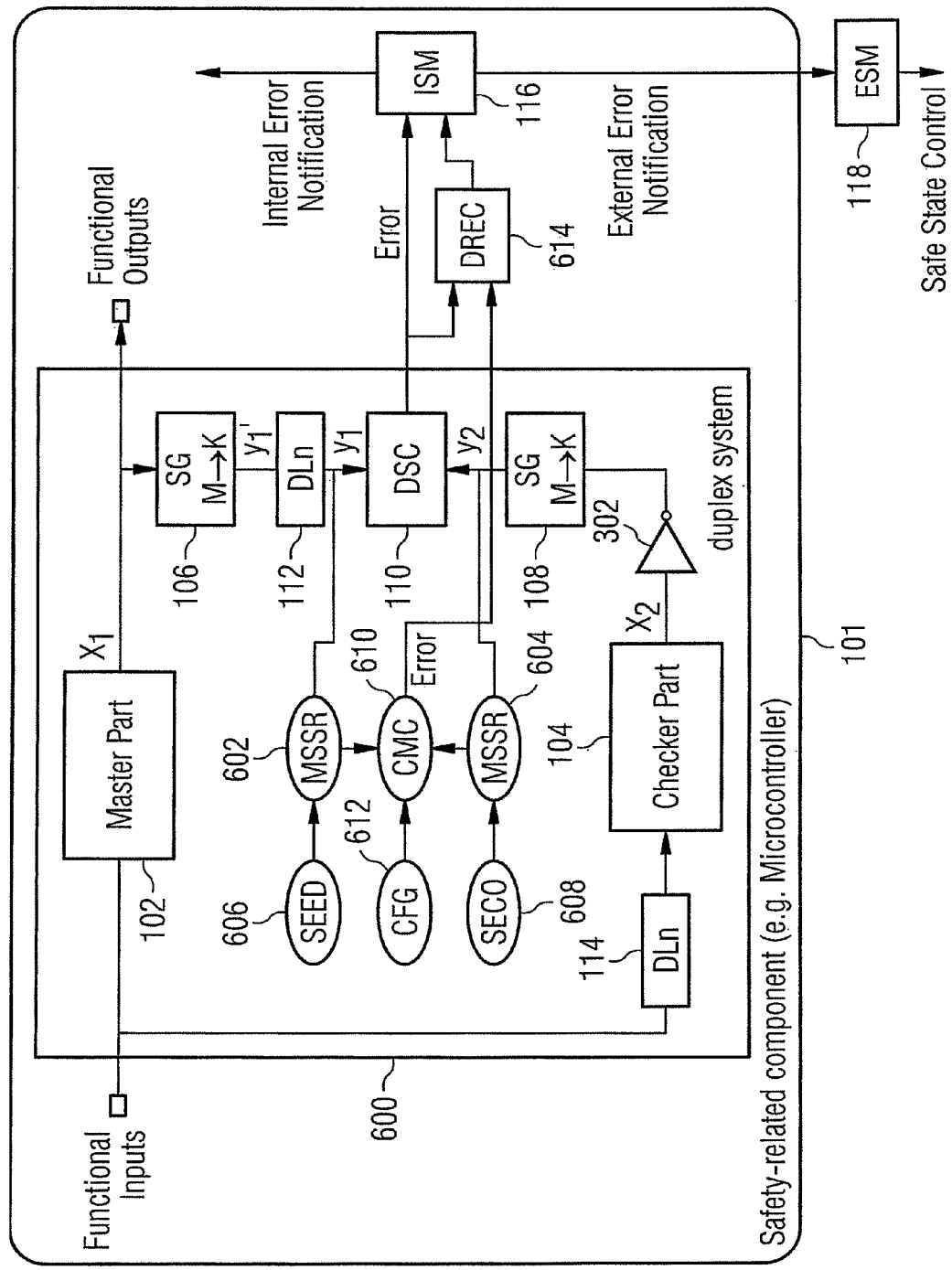
FIG. 6 is a schematic diagram of a duplex system, according to an embodiment of the invention.

FIG. 6 is a schematic diagram of a duplex system 600, according to an embodiment of the invention. Elements of the duplex system 600 which are identical to elements of the duplex system 100 and 300 have like reference numbers. The duplex system 600 includes temporal data encoder (TDE) engines 602 and 604, seed generators 606 and 608. In the exemplary embodiment as illustrated, the temporal data encoder engines 602 and 604 are multiple input linear feedback shift registers (MISRs) 602 and 604, however the scope of the invention includes other temporal data engines known to those of skill in the art, such as CRC polynomial generators with feedback as needed. The exemplary embodiment also includes a configurable MISR comparator (CMC) 610, a control unit (CFG) 612 and an error checker 614. In one embodiment of the invention, the error checker 614 is two-input or dual-rail error checker (DREC) 614.

As will be discussed more fully below, the MISRs 602 and 604 can generate temporal signatures based upon the accumulated histories of the signals (i.e., output signatures) $y_1$ and $y_2$. In effect, the duplex system 600 is designed to compare (via the CMC 610) accumulated histories of the signals $y_1$ and $y_2$ as embodied in the temporal signatures generated by the MISRs, as well as compare (via the DSC 110) the (instantaneous) output signatures $y_1$ and $y_2$.

The MISRs 602 and 604 may be K-bit shift registers. In one embodiment of the invention, the MISRs 602 and 604 are 32-bit shift registers. In operation, each seed generator 606 and 608 initializes its corresponding MISR with a predefined combination of 1s and 0s. For each clock cycle, each MISR 602 and 604 utilizes a logic function that computes an output value (i.e., a temporal signature) based upon predetermined feedback bit positions and combinatorial logic of the previous output value and input data (i.e., correspondingly received output signatures $y_1$ and $y_2$). In this manner, each MISR 602 and 604 generates a temporal signature (i.e., an accumulated history of the corresponding signature outputs $y_1$ and $y_2$). The MISRs 602 and 604 introduce a form of feedback into the system 600, since the current value stored in each MISR 602 and 604 depends partly on the current value of $y_1$ and $y_2$ and previous values of $y_1$ and $y_2$. The values stored in the MISRs 602 and 604 also represent a pseudorandom input to the CMC 610, since each of the stored values also depends upon the initial seed values stored in the K bit positions.

In one embodiment of the invention, the values stored in each MISR 602 and 604 are accessible to be read and analyzed by system hardware and/or software, collectively referred to as a TDE logic unit (e.g., a MISR logic unit) (not shown). In operation, a preconfigured code (also referred to as a test pattern) may be executed by the master and checker parts 102 and 104. The resultant temporal signatures may then be read from each of the MISRs, and depending upon the values of the temporal signatures as compared with the expected signature values (based upon the initial seed values and the operation of the master and checker parts on the test pattern), the system can determine whether the error originates from the master part 102 or the checker part 104. For example, if the checker part 104 is producing an error, then the system 600 may instruct (e.g., via output signals), components of the microcontroller or components controlled by an ECU to perform at sub-optimal (i.e., reduced) levels of operation.

Referring again to FIG. 6, the CMC 610 receives the temporal signatures from the MISRs 602 and 604, and based upon a comparison of the temporal signatures, generates an/error signal (e.g., for a single rail output, generates a 1 if there is no detected error and a 0 if there is a detected error). In one embodiment of the invention, the CMC 610 is equivalent to the STC 400 as illustrated in FIG. 4. It should be noted that that output of the DSC 110 and the CMC 610 may be either single-rail, dual-rail, or greater than dual-rail or other encoding. One of skill in the art has the knowledge to design the DREC 614 to receive either single-rail or dual-rail error signals, determine whether an error is present, and if so, whether the error originated from faults in the DSC 110, faults in the CMC 610, or faults in the redundant components of the system 600, based upon the states of the error signals.

For example, the DREC 614 receives the/error signal from the CMC 610 and the error signal from the DSC 110 (forming complementary values on the corresponding two lines). Assuming, for example, that the error signals are single-rail, if the DREC 614 receives a 1 from the CMC 610 and a 0 from the DSC 110, the system 600 is generating error-free functional outputs from the functional inputs, and in one embodiment, the DREG 614 then generates a 0. In one embodiment, the DREC 614 output is further combined with the original DSC 110 output to form a further error signaling with complementary values on the corresponding lines, and the ISM 116 generates an internal error notification and/or an external error notification having a value of 1 whenever the inputs to the ISM 116 is non-complementary (i.e., not 1,0 or 0,1), but otherwise in the error-free condition generates an internal error notification and/or an external error notification having a value of 0.

In one embodiment of the invention, the CFG 612 comprises control circuitry and/or software that controls one or more functions of the CMC 610. For example, the CFG 612 may be designed to enable or disable the CMC 610 based upon user commands or interior system signals (not shown). Although the FIG. 6 embodiment of the invention describes specific responses for given high and low values of the various error signals, the scope of the invention covers other embodiments that detect data errors based on different combinations of values of the error signals.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A redundant system, comprising:
   a hardware-implemented master part configured to receive an input signal and generate a binary output signal;
   a first clock delay configured to receive the input signal and generate a delayed input signal;
   a first signature generator coupled to the hardware-implemented master part and configured to receive the binary output signal and generate a first output signature based thereon;
   a second clock delay coupled to the first signature generator and configured to receive the first output signature and generate a delayed first output signature;
   a checker part coupled to the first clock delay and configured to receive the delayed input signal and generate a delayed binary output signal based thereon;
   a second signature generator coupled to the checker part and configured to receive the delayed binary output signal and generate a delayed second output signature based thereon; and
   a comparator coupled to the second clock delay and the second signature generator, the comparator configured to receive the delayed first output signature and the delayed second output signature and generate an error signal, a state of the error signal based upon a comparison of the delayed first output signature with the delayed second output signature.

2. The redundant system according to claim 1, wherein the second clock delay delays the input signal by n clock cycles and the first clock delay delays the first output signature by said n clock cycles.

3. The redundant system according to claim 1, wherein the hardware-implemented master part comprises first circuitry and the checker part comprises second circuitry redundant to the first circuitry.

4. The redundant system according to claim 1, wherein the binary output signal comprises M binary components, and wherein the first signature generator is a first compactor, the first compactor configured to compact the M binary components to generate the first output signature comprising K binary components, where K<M.

5. The redundant system according to claim 1, wherein the binary output signal comprises M binary components, and wherein the first signature generator is a first compactor, the first compactor configured to compact a subset J of the M binary components to generate the first output signature comprising K+(M−J) binary components, wherein the K binary components are generated from the compacted subset J of the M binary components, and wherein where K<J≤M.

6. The redundant system according to claim 4, wherein the first compactor comprises a compaction matrix H, wherein y'=Hx$_1$, wherein the vector y' is the first output signature and the vector x$_1$ is the binary output signal of the hardware-implemented master part.

7. The redundant system according to claim 6, wherein the compaction matrix H has the property that if the vector x$_1$ is an All-1 vector of M ones, the vector y' is generated that is an All-1 vector of K ones.

8. The redundant system according to claim 6, wherein the number of ones in each row of the compaction matrix H is odd and the columns of the compaction matrix H are pair-wise different.

9. The redundant system according to claim 6, wherein the second signature generator is a second compactor, the second compactor configured to compact M binary components of the delayed binary output signal to generate the delayed second output signature comprising K binary components, wherein K<M, and wherein the second compactor comprises the compaction matrix H.

10. The redundant system according to claim 6, further comprising an inverter coupled between the checker part and the second signature generator, the inverter configured to invert the delayed binary output signal to generate an inverted delayed binary output signal, wherein the second signature generator is a second compactor, the second compactor configured to compact M binary components of the inverted delayed binary output signal to generate an inverted delayed second output signature comprising K binary components, wherein K<M, and wherein the second compactor comprises a compaction matrix B, the compaction matrix B configured to generate the inverted delayed second output signature to be an inversion of the delayed first output signature.

11. The redundant system according to claim 6, wherein the comparator is a self-testing comparator (STC).

12. The redundant system according to claim 11, wherein the STC comprises an intermediate-value-builder (IVB) circuit coupled to an assignment circuit, the IVB circuit comprising a plurality of XOR-Gates and the assignment circuit comprising at least one OR-Gate and at least one NAND-Gate, the IVB configured to receive the delayed first output signature and the delayed second output signature collectively comprising 2n binary inputs and generate n intermediate binary outputs $z_1, \ldots z_n$, and the assignment circuit configured to receive the n intermediate binary outputs $z_1, \ldots, z_n$, and generate r error signals $\text{Error}_1, \ldots \text{Error}_r$, wherein r≥1.

13. The redundant system according to claim 12, wherein $$z_i = u_i \oplus v_i \oplus a_1 u_1 \oplus a_2 u_2 \oplus \ldots a_n u_n \oplus b_1 v_1 \oplus b_2 v_3 \oplus \ldots \oplus b_n v_n \oplus A_i,$$

$u_1, \ldots, u_n$ and $v_1, \ldots, v_n$ are the 2n binary inputs, wherein $a_i$ and $b_i$ for $i=1, \ldots, n$ are binary values, and wherein $$a_i \wedge b_j = 0,\ V_{i=1}^n a_i \vee V_{j=1}^n b_j = 1.$$

14. The redundant system according to claim 13, wherein for r=2, $$\text{Error}_1 = V_{i=1}^n (z_i \oplus A_i),$$

$$\text{Error}_2 = \overline{\wedge_{i=1}^n (z_i \oplus A_i)}.$$

wherein $A_i$ for $i=1, \ldots, n$ are Boolean constants.

15. The redundant system according to claim 12, wherein the delayed first output signature and the delayed second output signature are binary complements of one another.

16. The redundant system according to claim 1, further comprising:
   a first temporal data encoder (TDE) coupled to the second clock delay and the first signature generator;
   a configurable MISR comparator (CMC) coupled to the first TDE;
   a second TDE coupled to the CMC and the second signature generator; and
   an error checker coupled to the CMC and the comparator.

17. The redundant system according to claim 16, wherein the error checker is a dual rail error checker (DREC).

18. The redundant system according to claim 16, wherein the first TDE is configured to generate a first temporal signature based upon an accumulated history of the delayed first output signature, the second TDE is configured to generate a second temporal signature based upon an accumulated history of the delayed second output signature, the CMC is configured to generate a second error signal based upon a comparison of the first and second temporal signatures, and the error checker is configured to compare the second error signal and the error signal to generate a third error signal.

19. The redundant system according to claim 18, further comprising a TDE logic unit configured to, if any of the first, second or third error signals indicate an error, analyze the first temporal signature and the second temporal signature to determine whether the error originated from the master part or the checker part, wherein the first temporal signature and the second temporal signature are generated from the input signal being a predetermined test signal.

20. The redundant system according to claim 1, wherein the checker part and the second signature generator are at least partially implemented in a combined circuit.

21. A method for signature-based redundancy comparison, comprising:
receiving, by a master part, an input signal and generating, by the master part, a binary output signal;
generating a delayed input signal based on the input signal;
generating a first output signature based on the binary output signal;
generating a delayed first output signature based on the first output signature;
generating a delayed binary output signal based on the delayed input signal;
generating, by a checker part, a delayed second output signature based on the delayed binary output signal;
comparing, by a comparator, the delayed first output signature with the delayed second output signature; and
generating an error signal, a state of the error signal based upon the comparison.

22. The method according to claim 21, wherein the input signal is delayed by n clock cycles and the first output signature is delayed by said n clock cycles.

23. The method according to claim 21, wherein the master part comprises first circuitry and the checker part comprises second circuitry redundant to the first circuitry.

24. The method according to claim 21, wherein the binary output signal comprises M binary components and the first output signature comprises K binary components compacted from the M binary components, where K<M.

25. The method according to claim 24, wherein a compaction matrix H has K rows and M columns, wherein y'=Hx$_1$, and wherein vector y' is the first output signature and vector x$_1$ is the binary output signal.

26. The method according to claim 25 wherein the compaction matrix H has the property that if the vector x$_1$ comprises M binary ones, the vector y' is generated that comprises K binary ones.

27. The method according to claim 25, wherein the number of ones in each row of the compaction matrix H is odd and the columns of the compaction matrix H are pair-wise different.

28. The method according to claim 25, wherein the delayed binary output signal comprises M binary components and the delayed second output signature comprises K binary components compacted from the M binary components utilizing the compaction matrix H.

29. The method according to claim 25, further comprising inverting the delayed binary output signal to generate an inverted delayed binary output signal, wherein the inverted delayed binary output signal comprises M binary components and the inverted delayed second output signature comprises K binary components compacted from the M binary components utilizing a compaction matrix B, the compaction matrix B configured to generate the inverted delayed second output signature to be an inversion of the delayed first output signature.

30. The method according to claim 21, wherein the comparator is a self-testing comparator (STC), the STC comprising an intermediate-value-builder (IVB) circuit and an assignment circuit, the IVB circuit comprising a plurality of XOR-Gates and the assignment circuit comprising at least one OR-Gate and at least one NAND-Gate, the IVB configured to receive the delayed first output signature and the delayed second output signature collectively comprising 2n binary inputs and generate n intermediate binary outputs and the assignment circuit configured to receive the n intermediate binary outputs $z_1, \ldots, z_n$, and generate r error signals $Error_1, \ldots Error_r$, wherein $r \geq 1$.

31. The method according to claim 30, wherein $$z_i = u_i \oplus v_i \oplus a_1 u_1 \oplus a_2 u_2 \oplus \ldots a_n u_n \oplus b_1 v_1 \oplus b_2 v_3 \oplus \ldots \oplus b_n v_n \oplus A_i,$$

$u_1, \ldots u_n$ and $v_1, \ldots, v_n$ are the 2n binary inputs, wherein $a_i$, $b_i$, and $A_i$ for $i=1, \ldots, n$ are binary values, and wherein $$a_i \vee b_j = 0,\ V_{i=1}^n a_i \vee V_{j=1}^n b_j = 1.$$

32. The method according to claim 31, wherein for r=2, $$Error_1 = V_{i=1}^n (z_i \oplus A_i),$$

$$Error_2 = \overline{\wedge_{i=1}^n (z_i \oplus A_i)}.$$

33. The method according to claim 30, wherein the delayed first output signature and the delayed second output signature are binary complements of one another.

34. The method according to claim 21, further comprising:
generating a first temporal signature based upon an accumulated history of the delayed first output signature;
generating a second temporal signature based upon an accumulated history of the delayed second output signature;
generating a second error signal based upon a comparison of the first and second temporal signatures; and
comparing the second error signal and the error signal to generate a third error signal.

35. The method according to claim 34, further comprising, if any of the first, second or third error signals indicate an error, analyzing the first temporal signature and the second temporal signature to determine whether the error originated from the master part or the checker part, wherein the first temporal signature and the second temporal signature are generated from the input signal being a predetermined test signal.

36. A system for signature-based redundancy comparison, comprising:
means for receiving, by a hardware-implemented master part, an input signal and means for generating, by the hardware-implemented master part, a binary output signal;
means for generating a delayed input signal based on the input signal;
means for generating a first output signature based on the binary output signal;
means for generating a delayed first output signature based on the first output signature;
means for generating a delayed binary output signal based on the delayed input signal;
means for generating, by a checker part, a delayed second output signature based on the delayed binary output signal;
means for comparing the delayed first output signature with the delayed second output signature; and
means for generating an error signal, a state of the error signal based upon the comparison.

* * * * *